United States Patent
Nayak (10) Patent No.: US 6,370,140 B1
(45) Date of Patent: *Apr. 9, 2002

(54) PROGRAMMABLE INTERCONNECT MATRIX ARCHITECTURE FOR COMPLEX PROGRAMMABLE LOGIC DEVICE

(75) Inventor: Anup Nayak, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/009,137

(22) Filed: Jan. 20, 1998

(51) Int. Cl.[7] ............................................ H03K 19/173
(52) U.S. Cl. .................. 370/386; 340/825.83; 370/380; 326/38; 326/39; 326/41
(58) Field of Search ................................. 370/357, 369, 370/370, 360, 361, 380, 386, 539; 340/825.83, 825.86, 825.87; 326/38, 40, 41, 39

(56) References Cited

U.S. PATENT DOCUMENTS

| | | | | |
|---|---|---|---|---|
| 5,455,525 A | * | 10/1995 | Ho et al. | 326/41 |
| 5,491,431 A | * | 2/1996 | Nasserbakht | 326/38 |
| 5,594,367 A | * | 1/1997 | Trimberger et al. | 326/38 |
| 5,698,992 A | * | 12/1997 | El Ayat et al. | 326/41 |
| 5,742,181 A | * | 4/1998 | Rush | 326/38 |
| 5,818,254 A | * | 10/1998 | Agrawal et al. | 326/39 |
| 5,848,066 A | * | 12/1998 | Nazarian et al. | 370/380 |
| 5,869,981 A | * | 2/1999 | Agrawal et al. | 326/39 |
| 6,137,308 A | * | 10/2000 | Nayak | 326/38 |

* cited by examiner

Primary Examiner—Wellington Chin
Assistant Examiner—Frank Duong
(74) Attorney, Agent, or Firm—Wagner, Murabito & Hao LLP (57) ABSTRACT

A routing architecture which includes a plurality of switching elements grouped so as to provide one or more outputs for a plurality of inputs, wherein the grouping represents a hierarchy of selection levels. The routing architecture may be configured such that at each of the selection levels fewer outputs are provided than inputs are received. The selection levels may be implemented using one or more multiplexers at each of the levels. The routing architecture may be embodied in a programmable logic device which may also include a number of logic blocks. Each of the logic blocks may be coupled to receive at least one of the outputs of the routing architecture and the programmable logic device may be configured so that a subset of the plurality of inputs to the routing architecture are provided by one or more of the logic blocks.

14 Claims, 8 Drawing Sheets

PROGRAMMABLE INTERCONNECT MATRIX ARCHITECTURE FOR COMPLEX PROGRAMMABLE LOGIC DEVICE

RELATED APPLICATION

The present application is related to co-pending Ser. No. 09/009,569, entitled "Programmable Interconnect Matrix Architecture For Complex Programmable Logic Device", filed Jan. 20, 1998, by Anup Nayak assigned to the assignee of the present invention.

FIELD OF THE INVENTION

The present invention relates to programmable logic devices and, more particularly, to a routing architecture for such devices.

BACKGROUND

Various programmable logic architectures are known, including, for example, programmable logic devices ("PLDs"), programmable logic arrays ("PLAs"), complex programmable logic devices ("CPLDs"), field programmable gate arrays ("FPGAs") and programmable array logic ("PAL"). Although there are differences between these various architectures, each of the architectures typically includes a set of input conductors directly coupled as inputs to an array of logic gates (e.g., a product term array made up of logical AND gates), the outputs of which, in turn, act as inputs to another portion of the logic device.

For complex programmable logic devices, wherein the number of input conductors and the number of logical AND gates to which they connect are both quite large compared with other programmable logic architectures, maintaining full connectability of the product term array for each input conductor becomes impractical for several reasons. First, to maintain full connectability the size of the input field of each logical AND gate in the product term array must increase for each input conductor that is added. Second, the addition of a single input conductor requires the addition of a number of programmable elements equal to the total number of logical AND gates, one for each logical AND gate. Third, the total number of conductors that are routed from the programmable elements to the logical AND gates increases as the number of programmable elements increases. All of these consequences of attempting to maintain full connectability for CPLDs results in a large increase in die space for the product term array without a proportionate increase in functionality over a less complex PLD.

One solution to this dilemma is to interpose a connection circuit that is not fully connectable between the set of input conductors and the product term array of a logic block, wherein the inputs of the connection circuit are coupled to the input conductors of the CPLD and the outputs of the connection circuit are coupled to the inputs of the product term array of a logic block. One such connection circuit is associated with each CPLD logic block, or multiple numbers of logic blocks, and provides a unique connection between CPLD inputs and the product term array inputs of the associated logic block. Typically, this connection circuit allows only a subset of the CPLD inputs to be connected to the product term array inputs.

Early CPLDs implemented this connection circuit as a programmable, fully populated cross-point matrix similar to that used in a fully programmable product term array. Each input conductor of the connection circuit is connected to a number of programmable elements equal to the number of output conductors of the connection circuit, wherein in each programmable element is capable of providing a unique connection between the input conductor and one of the output conductors. Such a connection circuit guarantees a route for every possible combination of input signals up to the total number of output conductors of the front end connection, regardless of the ordering of the combination. The fully populated cross-point matrix may thus be said to have "full connectability," wherein the term connectability denotes the ability of the connection circuit to connect an input conductor of the connection circuit to the output conductors of the connection circuit. A fully connectable connection circuit is one that can connect every input conductor to every output conductor.

Such early approaches were rather inefficient. For example, the number of programmable elements required for each connection circuit is equal to the total number of CPLD input conductors, $n_{in}$, multiplied by the number of output conductors, $n_{out}$, for the connection circuit, wherein $n_{out}$ is typically equal to the number of input terms for the product term array of the associated logic block. As a CPLD typically implements two or more connection circuits, this approach requires large amounts of die area.

Further, of the $n_{in}$ programmable elements connected to any one of the $n_{out}$ output conductors, only one of the programmable elements is ever programmed, regardless of the input signal selected for routing through the connection circuit. Otherwise, two or more input signals may be shorted together. Thus, the maximum number of programmable elements that are ever used to route any combination of input signals through a fully populated cross point matrix is $n_{out}$. This means that the maximum percentage of programmable elements that are used for any one connection circuit is equal to $0.1/n_{in}$. Therefore, the amount of die space required to implement the fully connectable cross-point matrix is excessive in light of the under utilization of the programmable elements. The inefficiency of such early approaches is only emphasized when the number $n_{in}$ of CPLD inputs increases.

An alternative connection circuit provides full connectability while requiring less "connectivity" than the fully populated cross-point matrix. The term connectivity refers to the total number of programmable elements provided by a connection circuit. This alternative connection circuit uses a number $n_{out}$ of $n_{in}$:1 multiplexers, wherein the output of each multiplexer is connected to an output conductor of the connection circuit. As each multiplexer requires only log $n_{in}$/log 2 programmable elements, the total number of programmable elements (the connectivity) for a fully connectable multiplexer array is reduced to $n_{out}$ multiplied by log $n_{in}$/log 2. This results in some savings of die space over the fully connectable cross-point matrix, however, the die space requirements are still excessive, especially when the number $n_{out}$ of CPLD inputs increases.

To further reduce the amount of semiconductor die area needed for a connection circuit, the connectivity of the connection circuit may be further reduced by providing even fewer programmable elements. This reduction in connectivity results in connection circuits that are not fully connectable, which means that every input conductor of the connection circuit cannot be connected to every output conductor of the connection circuit. The level of connectability for a connection circuit is related to the level of "routability" of the connection circuit. Here, the term routability denotes the probability that the connection circuit can provide a route (or signal path) for any given combination of input signals from the input conductors to the output conductors of the connection circuit. The routability of the connection circuit tends to increase with the connectability of the connection circuit.

Because every input conductor can no longer be connected to an output conductor, the number of routes through the connection circuit for a particular combination of input signals may be reduced when compared to the fully connectable connection circuits. So long as the connection circuit provides at least one route for every combination of input signals, the connection circuit is fully routable or 100% routable. If no route can be provided for a particular combination of input signals, the connection circuit is not fully routable. Fully connectable connection circuits have maximum routability as they provide a route for every permutation of input signals.

Connectivity for a multiplexer array is reduced by reducing the width of the input field for each multiplexer such that the number of input conductors that are coupled to each multiplexer is less than the total number of input conductors for the connection circuit. So long as each input signal is provided with at least one chance to route, that is, each input conductor is connected to at least one multiplexer, a successful routing for a particular logic function can be achieved regardless of the routability of the connection circuit. For such a constrained multiplexer, providing a route for a particular logic function may require a carefully chosen pin assignment for the CPLD such that the desired combination of input signals are connected to input conductors that have a route through the connection circuit to the output conductors. If the particular logic function is changed at a later time, the same pin assignment may not be able to provide a route for the selected combination of input signals for the altered logic function.

To better ensure that pin assignments do not have to be altered when a logic function is altered, the routability of the connection circuit should be maximized. As described above, a greater level of connectability for a connection circuit tends to result in a greater level of routability for the connection circuit. However, a greater level of connectability requires a greater level of connectivity, and more die area is consumed, which typically results in higher device costs and slower device speeds. The challenge then is to find the optimum balance between connectivity, connectability and routability for connection circuit.

Figure 1:
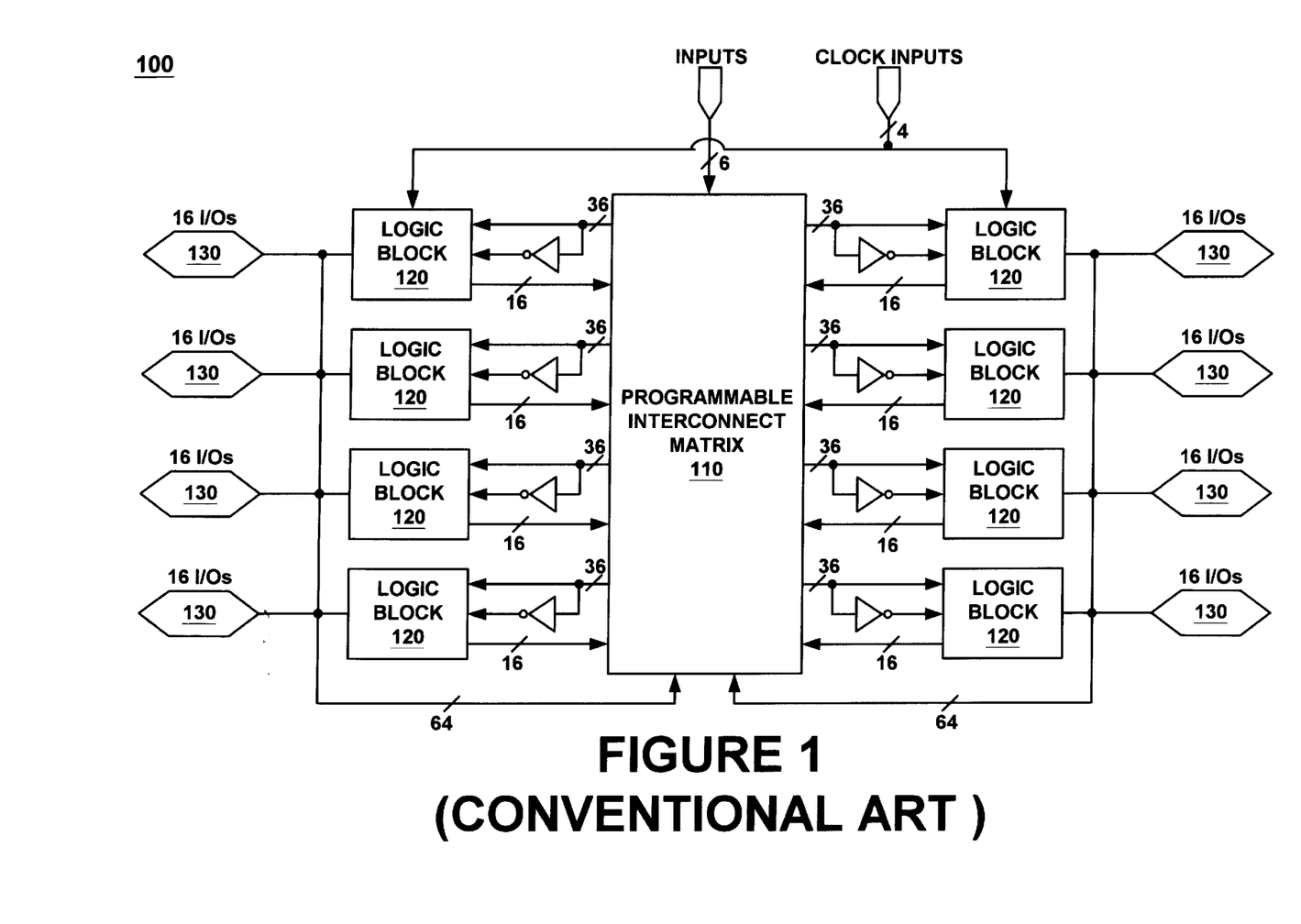
FIG. 1 illustrates a conventional complex programmable logic device.

FIG. 1 shows a conventional CPLD 100 which includes a connection circuit implemented as a programmable interconnect matrix ("PIM") 110 and eight logic blocks 120. Although eight logic blocks 120 are shown, as few as two logic blocks may be used in a conventional CPLD such as CPLD 100. CPLD 100 has a total of 262 inputs, each of which is connected to the PIM 110. The PIM 110 is capable of providing each logic block 120 with its own set of input terms by independently selecting as many as 36 of the possible 262 input signal as input terms for each logic block 120. As shown, the logical compliments for each of the 36 signals output by the PIM 110 are also provided to each logic block 120. Thus, each logic block receives as many as 72 input terms from the PIM 110.

The PIM 110 includes a number of programmable elements for controlling an array of multiplexers to reduce the total number of programmable elements required. The programmable elements may be volatile memory elements such as static random access memory ("SRAM") cells, non-volatile memory elements such as electrically erasable programmable read only memory ("EEPROM") cells, flash memory cells or fuses. Alternatively, the programmable elements of PIM 110 may be implemented to control a matrix of cross point switches, however, this increases the total number of programmable elements required to make the same number of connections. Whether the connections between input conductors and output conductors are provided by a cross-point switch matrix or by an array of multiplexers, each output conductor can be connected to a maximum of one input conductor. Thus, both forms of connection perform a multiplexing function in the sense that both forms of connection provide for the selection of one input conductor from a set of many input conductors. Therefore, as used herein, the term multiplexer should be understood to encompass any circuit that performs a multiplexing function, regardless of the number of programmable elements required to control that circuit.

The 262 inputs to the PIM 110 include 128 feedback signals, 128 input signals, and 6 dedicated input signals. Four clock signals may be provided directly to each of the logic blocks 120. Sixteen feedback signals are provided by each logic block 120. Each logic block 120 is programmed to perform selected logic functions using sub-combinations of the 72 input terms provided by the PIM 110. Each logic block 120 has 16 input/output ("I/O") pins 130, which may be used either as inputs to the PIM 110 or outputs of CPLD 100.

Conceptually, CPLD 100 may be regarded as a PIM coupled in series with 8 PLDs coupled in parallel, wherein each logic block 120 corresponds to a single PLD. Intermediate stages and the outputs of each of the 8 PLDs are fed back as inputs to the PIM. Depending on the particular set of input signals routed to the output of the PIM and the programmed logic functions for each logic block 120, the 8 PLDs may, in fact, act as two or more PLDs coupled in series with each other. CPLD 100 thus provides a highly versatile logic device which may be implemented on a single semiconductor die.

Figure 2:
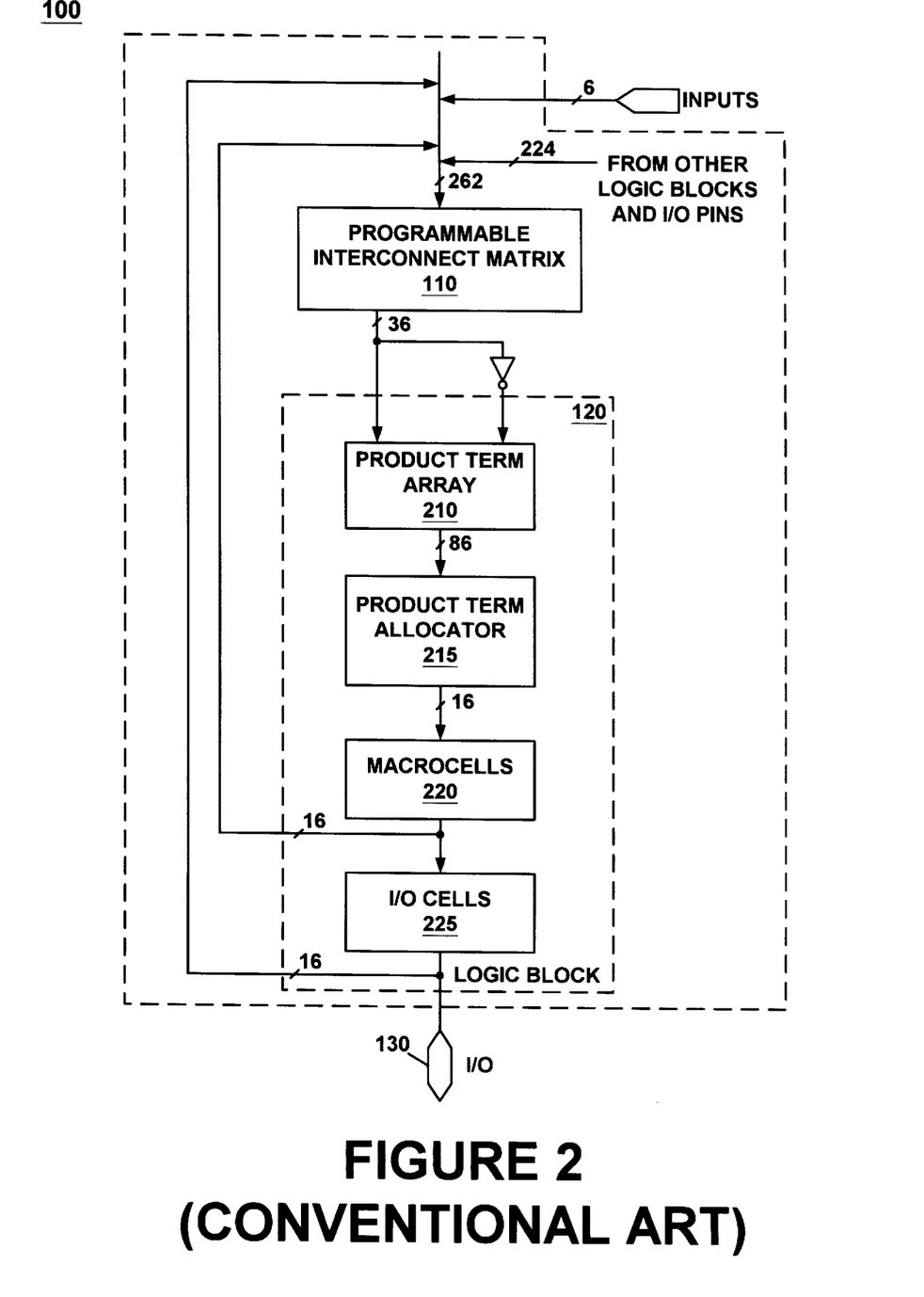
FIG. 2 illustrates the conventional complex programmable logic device of FIG. 1 in greater detail.

FIG. 2 shows portions of CPLD 100 in greater detail. Specifically, a logic block 120 is shown as including a product term array 210, a product term allocator 215, macrocells 220 and I/O cells 225. The product term array may be a fully programmable logical AND array. The product term allocator 215 allocates product terms from the product term array 210 to a number of macrocells (e.g., 16) 220. The product term allocator 215 "steers" product terms to the macrocells 220 as needed. For example, if one macrocell 220 requires 10 product terms while another requires only three product terms, the product term allocator 215 steers 10 product terms to the first macrocell and three product terms to the latter. Up to 16 product terms can be steered to any one macrocell.

The outputs for each of the 16 macrocells 220 are fed back to the PIM 110 as input signals. This specific architecture of the macrocells 220 may be any appropriate architecture and may include clocked registers and buffers. The 16 outputs of the macro cells 220 are also fed to 16 I/O cells 225. The output signals of the 16 I/O cells 225 are fed back as input signals to the PIM 110 and also provided to I/O pins 130.

Figure 3:
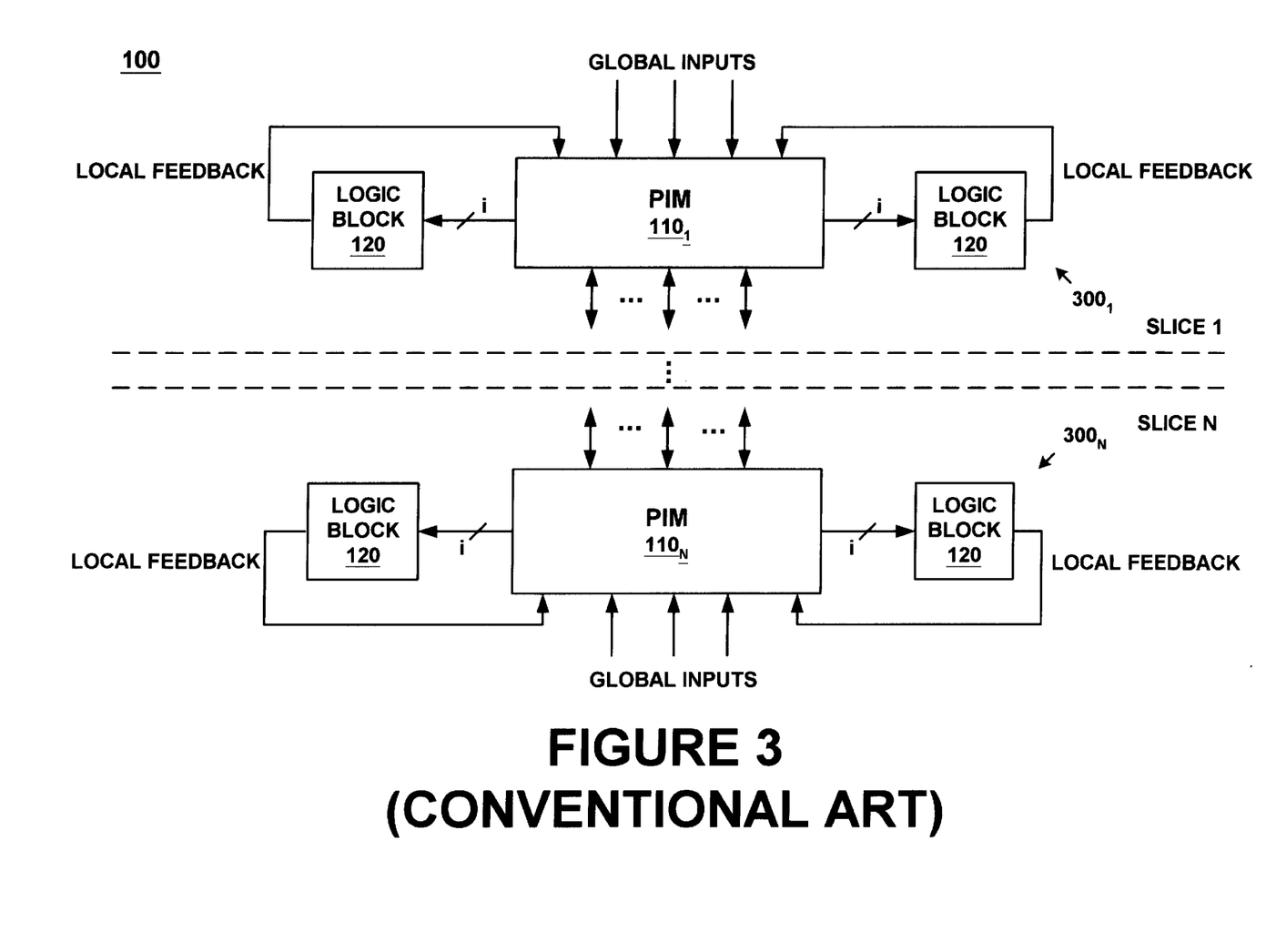
FIG. 3 is an alternative representation of the complex programmable logic device of FIG. 1.

FIG. 3 shows an alternative representation of CPLD 100. In this representation, CPLD 100 is divided into N slices, where each slice includes a pair of logic blocks 120 and an associated portion of the PIM $110_1$–$100_N$. In terms of die layout, each slice $300_1$–$300_N$ of CPLD 100 may be considered a building block for the overall CPLD 100. Interconnection between the PIM slices $110_1$–$110_N$ may be provided by other connection circuits which are fully connectable or less than fully connectable. As shown, each logic block 120 of a slice 300 receives "i" inputs from a corresponding PIM slice $110_1$–$110_N$. Each of the i inputs is selected from a pool of global inputs and logic block local feedbacks through the PIM 110. The number of inputs and the number of outputs possessed by the PIM 110 determine the number of possible combinations of input signals that can be selected for output by the PIM. The level of routability of the PIM 110 determines how many of the possible combinations can actually be routed by the PIM. To be fully routable, the PIM must provide a route to the outputs of the PIM for each possible combination of the input signals.

Figure 4:
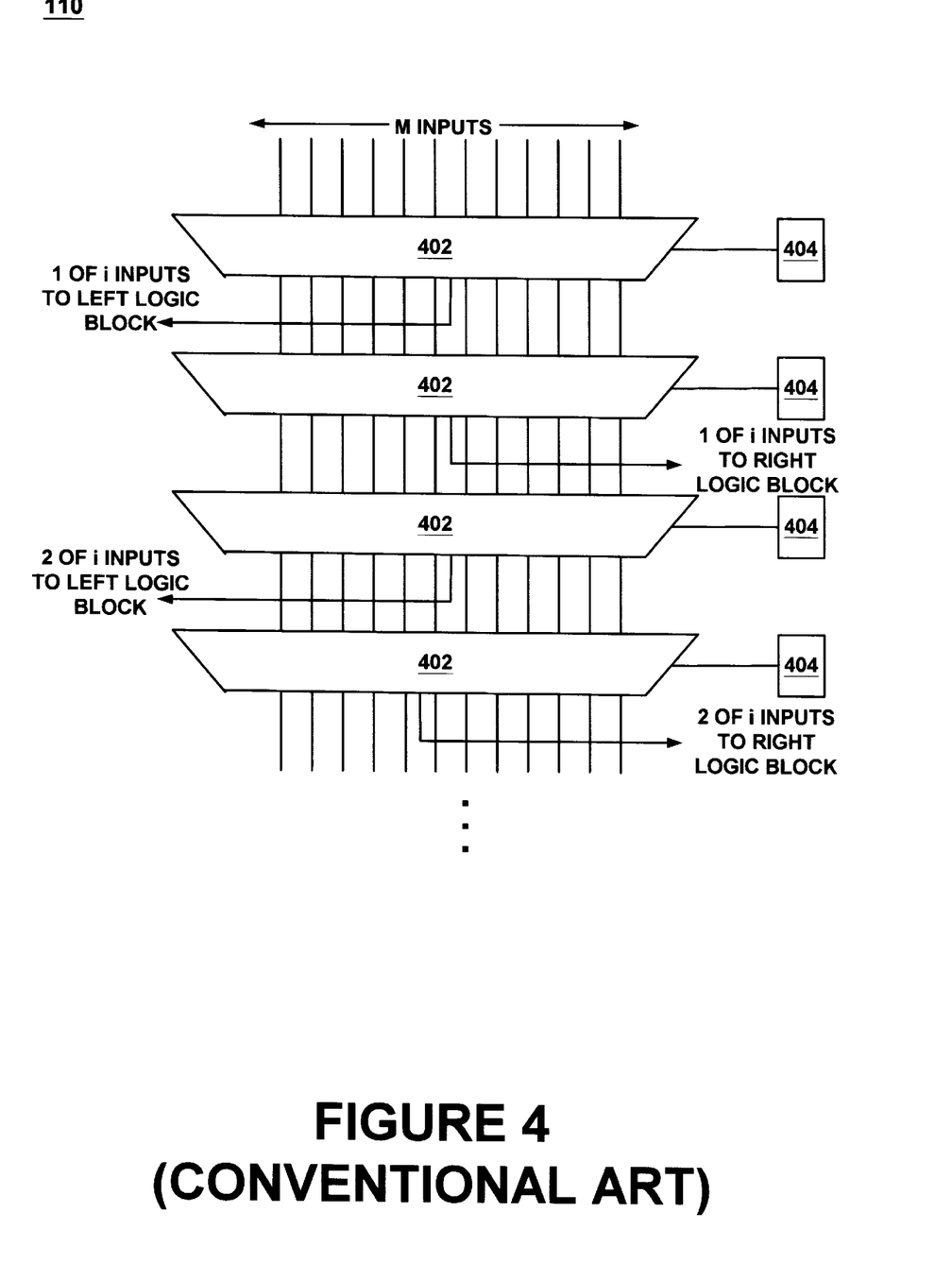
FIG. 4 illustrates the programmable interconnect matrix of the complex programmable logic device of FIG. 1 in greater detail.

As shown in FIG. 4, PIM 110 is a multiplexer-based interconnect with an M-input multiplexer 402 for each input to a logic block 120. Thus, for i inputs to an individual logic block 120, a PIM slice $110_1$–$110_N$ must include i multiplexers 402. For two logic blocks 120 per slice, this means that 2i multiplexers 402 per PIM slice must be provided. Associated with each multiplexer 402 are configuration memory bits 404 which are used to select which of the M inputs for each multiplexer 402 will be provided as the output of that multiplexer.

Figure 5:
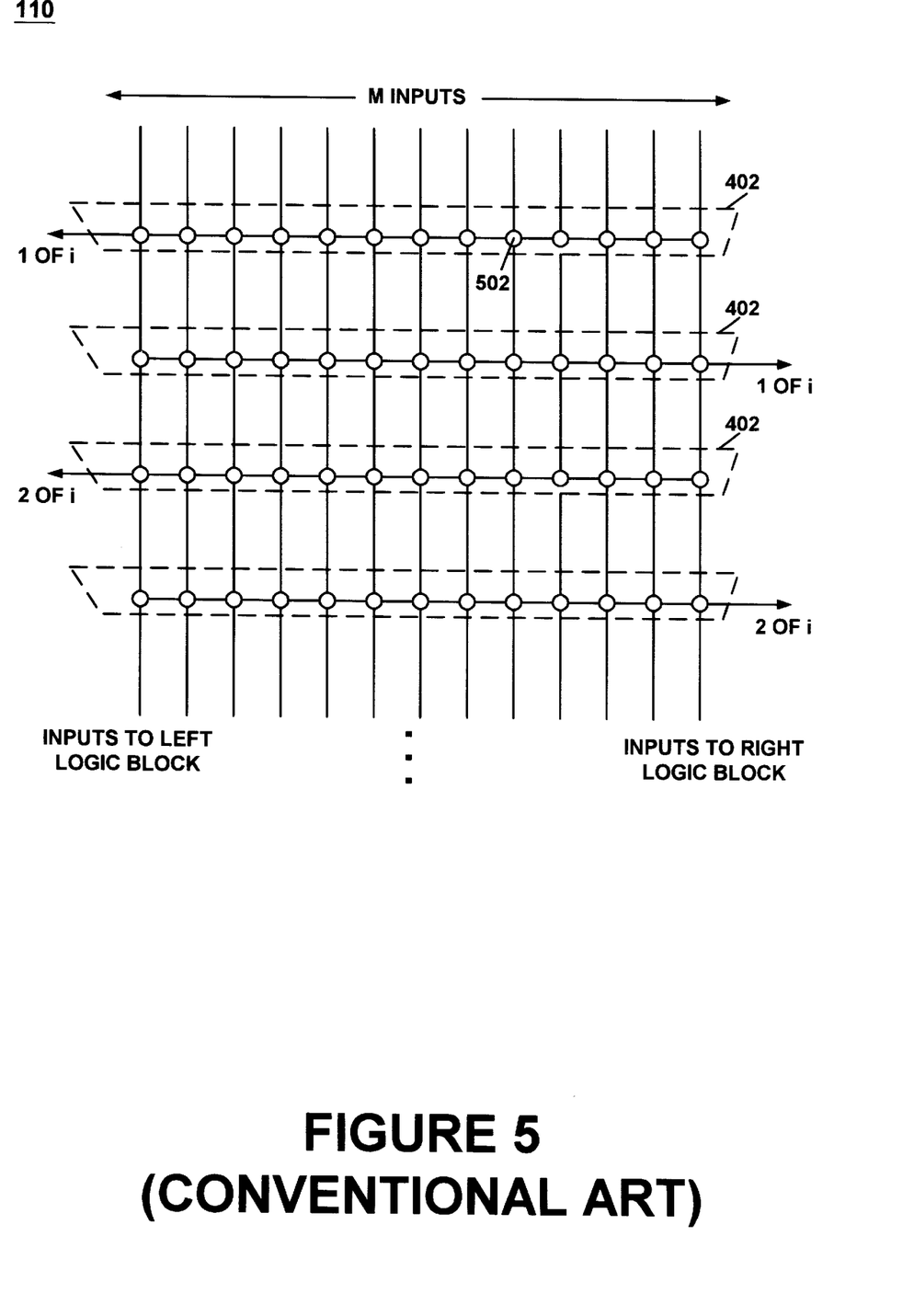
FIG. 5 is a detailed representation showing individual switching elements of the programmable interconnect matrix of FIG. 4.

As shown in FIG. 5, each M:1 multiplexer 402 uses M switching elements 502. The switching elements may be pass gates (i.e., transistors). Thus, there are M transistors for each input (of i inputs) to a logic block 120. If each i-input logic block 120 uses i multiplexers 402, there are M×i transistors for that logic block and 2M×i transistors for a pair of logic blocks 120 per slice 300. In total, then, the N slices 300 of CPLD 100 will require 2×N×M×i transistors or other switching elements to implement PIM 110. In addition, each multiplexer 402 typically requires M×i configuration bits 404 to select an appropriate input signal as an output. Thus, a total of 2×N×M×i configuration bits will be required for PIM 110.

The number of switching elements and configuration bits to implement PIM 110 is thus quite large. It would be desirable to achieve a similar routability as provided by PIM 110 while utilizing fewer selection elements and/or configuration bits.

SUMMARY OF THE INVENTION

The present invention provides, in one embodiment, a routing architecture which includes a plurality of switching elements grouped so as to provide one or more outputs for a plurality of inputs, wherein the grouping represents a hierarchy of selection levels. The routing architecture may be configured such that at each of the selection levels fewer outputs are provided than inputs are received. The selection levels may be implemented using one or more multiplexers at each of the levels.

In a further embodiment, the present invention provides a programmable logic device which includes a routing architecture having a plurality of switching elements grouped so as to provide one or more outputs for a plurality of inputs, the grouping representing a hierarchy of selection levels. Such a programmable logic device may also include a number of logic blocks, wherein each of the logic blocks is coupled to receive at least one of the outputs of the routing architecture. Further still, the programmable logic device may be configured so that a subset of the plurality of inputs to the routing architecture are provided by one or more of the logic blocks. The switching elements of the routing architecture may include a number of interconnected primary and secondary multiplexers. The interconnection of the primary and secondary multiplexers may, in such an embodiment, define the hierarchy of the selection levels. Each secondary multiplexer may have a number of corresponding primary multiplexers equal to the number of inputs of that secondary multiplexer.

In another embodiment of the present invention, a programmable interconnect matrix includes a plurality of multiplexers arranged in a multi-level interconnection scheme so as to provide a first number of output signals from a second number of input signals. Such a programmable interconnect matrix may be configured such that the plurality of multiplexers are arranged as primary multiplexers and secondary multiplexers, the primary multiplexers being configured to receive the input signals and the secondary multiplexers being configured to provide the output signals. Each secondary multiplexer may be coupled to an equal number of primary multiplexers.

In still a further embodiment of the present invention, a programmable logic device is provided which includes a programmable interconnect matrix having a plurality of multiplexers arranged in a multilevel interconnection scheme so as to provide a first number of output signals from a second number of input signals. Such a programmable logic device may also include a number of logic blocks, each coupled to receive one or more of the output signals from the programmable interconnect matrix. The plurality of multiplexers may include a number of primary multiplexers and a number of secondary multiplexers, wherein each of the secondary multiplexers is associated with a subset of the number of primary multiplexers and each is further configured to provide one of the number of output signals. The subset of primary multiplexers may further be selected in such a way that the logic block that receives the output signal is also the primary contributor of input signals to the subset of primary multiplexers. This would result in the logic block taking advantage of the principle of locality, i.e., where the signals produced by a logic block are more likely to be used by that logic block than signals produced by another logic block. The programmable logic device may be further configured such that at least one of the input signals is provided by one of the logic blocks.

In still a further embodiment of the present invention, a programmable interconnect matrix having a plurality of routing elements arranged in an hierarchical routing scheme is provided. The number of routing elements is equal to M+L×S for the case where the number of levels equals two, and where M represents the number of inputs to the programmable interconnect matrix, L represents the number of groups of outputs from the programmable interconnect matrix and S represents the number of routing elements at the lowest level of the hierarchical routing scheme. The programmable interconnect matrix may be embodied within a programmable logic device which also includes a number of logic blocks. Each of the logic blocks may be coupled to receive one of the groups of outputs from the programmable interconnect matrix. Further, at least one of the logic blocks may be configured to provide at least one of the inputs to the programmable interconnect matrix. In addition, or alternatively, the programmable logic device may include a number of such programmable interconnect matrices, each having an associated number of logic blocks.

BRIEF DESCRIPTION OF THE DRAWINGS

The present invention is illustrated by way of example, and not limitation, in the figures of the accompanying drawings in which.

DETAILED DESCRIPTION

Described herein is a new programmable interconnect matrix architecture for programmable logic devices, for example, complex programmable logic devices. The architecture includes a multi-level collection of multiplexers arranged to distribute M inputs to i outputs, each of the outputs being provided to a logic block in the programmable logic device. M could be a (hardwired) subset of a larger pool of input signals. The architecture may be implemented by use of a number S of primary or first-level multiplexers, each having M/S inputs. The S outputs of the primary multiplexers feed one or more S-input second-level or secondary multiplexers, each of which provide outputs that may be used as inputs to a logic block or further fed to lower level multiplexers whose outputs are then used as inputs to the logic blocks. As will be described below, the multi-level or hierarchical programmable interconnect matrix may be implemented with fewer transistors for the same routability than was possible with programmable interconnect matrices of the past. Further, a reduced number of configuration memory bits for this routability is achieved. In addition, the multi-level programmable interconnect matrix provides a lesser load on input and output signals of the programmable interconnect matrix as compared to schemes of the past. The multi-level architecture also provides the capability to efficiently serve several logic blocks in a slice of a programmable logic device from a single programmable interconnect matrix slice without the need to linearly scale the transistor count for each slice of programmable interconnect matrix with the number of logic blocks in the slice. These and other advantages and features of the present invention are discussed with reference to certain illustrated embodiments thereof. However, it should be appreciated that the present invention is not limited to these examples. Rather, the invention should only be measured in terms of the claims which follow this description.

The present invention provides, in one embodiment, a routing architecture which includes a plurality of switching elements grouped so as to provide one or more outputs for a plurality of inputs, wherein the grouping represents a hierarchy of selection levels. The routing architecture may be configured such that at each of the selection levels fewer outputs are provided than inputs are received. The selection levels may be implemented using one or more multiplexers at each of the levels.

In a further embodiment, the present invention provides a programmable logic device which includes a routing architecture having a plurality of switching elements grouped so as to provide one or more outputs for a plurality of inputs, the grouping representing a hierarchy of selection levels. Such a programmable logic device may also include a number of logic blocks, wherein each of the logic blocks is coupled to receive at least one of the outputs of the routing architecture. Further still, the programmable logic device may be configured so that a subset of the plurality of inputs to the routing architecture are provided by one or more of the logic blocks. The switching elements of the routing architecture may include a number of interconnected primary and secondary multiplexers. The interconnection of the primary and secondary multiplexers may, in such an embodiment, define the hierarchy of the selection levels. Each secondary multiplexer may have a number of corresponding primary multiplexers equal to the number of inputs of that secondary multiplexer.

In another embodiment of the present invention, a programmable interconnect matrix includes a plurality of multiplexers arranged in a multi-level interconnection scheme so as to provide a first number of output signals from a second number of input signals. Such a programmable interconnect matrix may be configured such that the plurality of multiplexers are arranged as primary multiplexers and secondary multiplexers, the primary multiplexers being configured to receive the input signals and the secondary multiplexers being configured to provide the output signals. Each secondary multiplexer may be coupled to an equal number of primary multiplexers.

In still a further embodiment of the present invention, a programmable logic device is provided which includes a programmable interconnect matrix having a plurality of multiplexers arranged in a multilevel interconnection scheme so as to provide a first number of output signals from a second number of input signals. Such a programmable logic device may also include a number of logic blocks, each coupled to receive one or more of the output signals from the programmable interconnect matrix. The plurality of multiplexers may include a number of primary multiplexers and a number of secondary multiplexers, wherein each of the secondary multiplexers is associated with a subset of the number of primary multiplexers and each is further configured to provide one of the number of output signals. The programmable logic device may be further configured such that at least one of the input signals is provided by one of the logic blocks.

In yet a further embodiment of the present invention, a programmable interconnect matrix having a plurality of routing elements arranged in an hierarchical routing scheme is provided. The number of routing elements is equal to M+L×S, where Misrepresents either a subset of or the total of the number of inputs to the programmable interconnect matrix, L represents the number of groups of outputs from the programmable interconnect matrix and S represents the number of routing elements at the lowest level of the hierarchical routing scheme. The programmable interconnect matrix may be embodied within a programmable logic device which also includes a number of logic blocks. Each of the logic blocks may be coupled to receive one of the groups of outputs from the programmable interconnect matrix. Further, at least one of the logic blocks may be configured to provide at least one of the inputs to the programmable interconnect matrix. In addition, or alternatively, the programmable logic device may include a number of such programmable interconnect matrices, each having an associated number of logic blocks. These and other features and advantages of the present invention are discussed below, beginning with reference to FIG. 6.

Figure 6:
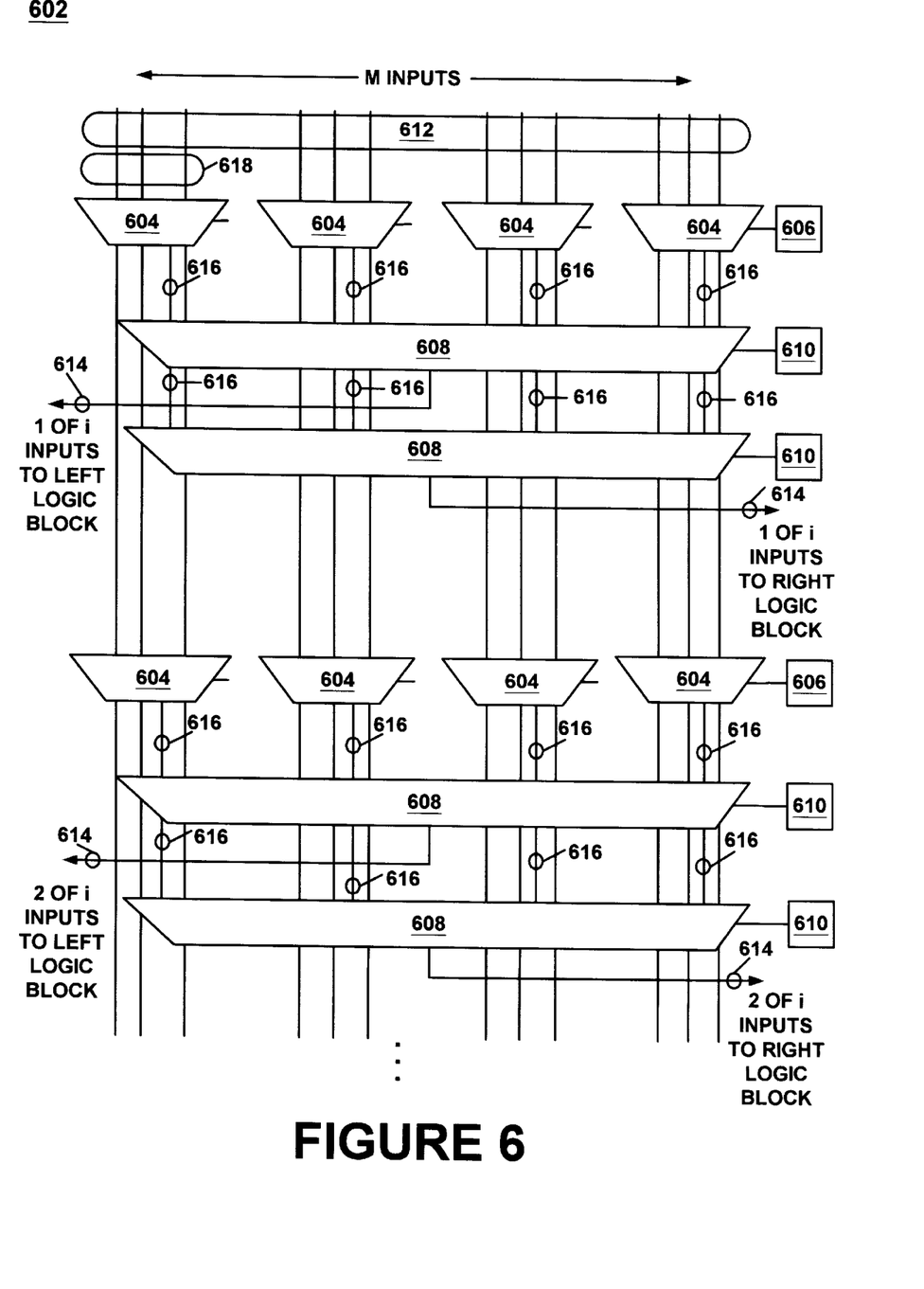
FIG. 6 illustrates one embodiment of a programmable interconnect matrix configured in accordance with the present invention.

FIG. 6 illustrates a programmable interconnect matrix 602 for use in a programmable logic device. Programmable interconnect matrix 602 is one embodiment of the multi-level or hierarchical routing architecture of the present invention and allows for routing an input signal to an output via the routing architecture. In particular, programmable interconnect matrix 602 includes a plurality of multiplexers arranged in a multi-level interconnection scheme so as to provide a first number of output signals from a second number of input signals. The multiplexers are arranged as primary multiplexers 604 and secondary multiplexers 608. The primary multiplexers 604 are each under the control of configuration bits 606. The secondary multiplexers 608 are under the control of configuration bits 610. The primary multiplexers 604 are configured to receive the M input signals 612. As discussed above, the input signals 612 may be global inputs or a subset thereof to the programmable interconnect matrix 602 or local feedback signals from associated logic blocks (not shown) within the programmable logic device. The secondary multiplexers 608 are configured to provide the output signals 614 to these logic blocks. Each logic block may receive up to i input signals 614. Often, the logic blocks will be symmetrical in that they will each receive an equal number i of input signals 614. However, in some embodiments, different logic blocks may receive different numbers of input signals 614 without departing from the spirit and scope of the present invention.

The routing within the programmable interconnect matrix 602 may be achieved by selecting one of the input signals 612 at a first level of the multi-level routing architecture (e.g., a primary multiplexer 604) to provide an intermediate signal 616. The intermediate signal 616 may then be selected at a second level of the routing architecture (e.g., a secondary multiplexer 608) to provide on,of the output signals 614. In either (or both) case(s), the selection may be achieved by programming a primary multiplexer 604 and/or a secondary multiplexer 608 using the corresponding configuration bits 606 and/or 610. The configuration bits 606 and/or 610 may be programmable elements such as fuses, antifuses or non-volatile memory cells (e.g., EEPROM and/or flash memory cells). Volatile memory cells may be used, however, the utility of such an approach is less advantageous that those where non-volatile memory cells are used. This is because the volatile memory cells will lose their programmed state when power is removed from the programmable logic device and, hence, the programmed configuration for the routing architecture will also be lost.

Each of the primary multiplexers 604 is configured to receive a subset of the input signals 612. Each primary multiplexer 604, in turn, provides, from the subset of the input signal 612, an output signal 616 to one or more associated secondary multiplexers 608. Thus, each of the secondary multiplexers 608 is associated with a subset of the total number of primary multiplexers 604 of the programmable interconnect matrix 602.

In general, the M input signals 612 are divided into S segments 618, wherein each signal of a segment 618 is provided as an input to a primary multiplexer 604. The output intermediate signals 616 from each primary multiplexer 604 are provided as inputs to a secondary multiplexer 608 which, under the control of configuration bits 610, selects one of the signals 616 as an input signal 614 to a logic block. This pattern is repeated i times for each logic block. The M primary inputs to each set of these i sets may be or may not be identical signals. Referring back to the slice representation of a programmable logic device as shown in FIG. 3, if each slice includes two logic blocks, then for the 2i output signals from pin 602, there will be 2i secondary multiplexers 608 and M·i/S primary multiplexers 604. M configuration bits 606 will be required to control one group of primary multiplexers 604 (wherein a group of primary multiplexers is associated with a single output provided by a single secondary multiplexer 608). S configuration bits 610 are required to control the secondary multiplexer 608. Thus, for each pair of outputs 614 (of which there may be i such outputs per logic block) M+2S configuration bits 606 and 610 are required.

In accordance with this architecture then, a plurality of input signals is divided into segments, each segment including a number of the input signals. One or more of the input signals is (are) selected from the segments to produce one or more intermediate signal(s). The intermediate signal(s) is (are) then selected as outputs from the programmable interconnect matrix 602. The selections at one or more of the various levels in the routing architecture may be accomplished using programmable configuration bits to control respective multiplexers.

Figure 7:
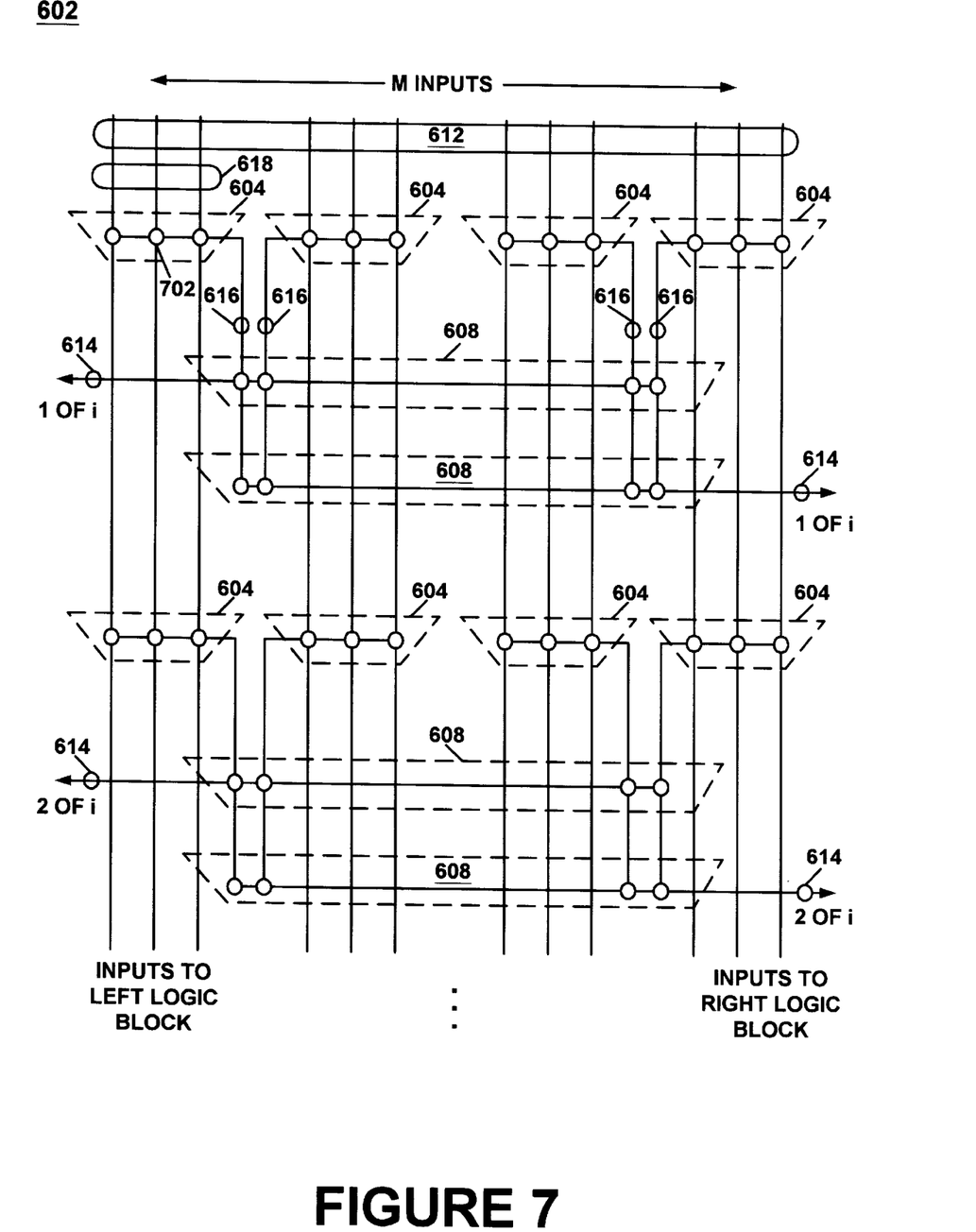
FIG. 7 is a detailed representation showing individual switching elements within the hi programmable interconnect matrix illustrated in FIG. 6.

FIG. 7 illustrates programmable interconnect matrix 602 in more detail. In particular, individual switching elements 702 for each of the primary multiplexers 604 and secondary multiplexers 608 are shown. The switching elements 702 may be pass gates (i.e., transistors) or other programmable elements such as fuses, antifuses, non-volatile (or volatile) memory elements, etc. As shown in this illustration, each of the segments 618 of the M input signal 612 are provided to associated switching elements 702 within each of the primary multiplexers 604. Output intermediate signals 616 from the primary multiplexers 604 are provided to the switching elements 702 in the secondary multiplexers 608. Routing of an individual input signal is achieved by programming the appropriate switching elements 702 in the primary multiplexers 604 and secondary multiplexers 608 to route the input signal to an output 614 of a secondary multiplexer 608. The number of switching elements for each primary multiplexer 604 is equal to M/S where M represents the number of inputs to the programmable interconnect matrix 602 and S represents the number of switching or routing elements in the secondary multiplexers (e.g., the number of routing elements at the lowest level of the hierarchical routing scheme). Although the M inputs to the primary multiplexers 604 corresponding to each of the i outputs of the programmable interconnect matrix are shown to be identical in FIG. 7, the present invention may be implemented in other ways so that the M inputs to each of the i sets of switching elements may be different. For each pair of logic blocks per slice then, the associated primary and secondary multiplexers will use M+2S transistors per input where transistors are used as switching elements. Thus, for i inputs, a total of i(M+2S) transistors are used. This is a reduction over the conventional scheme illustrated in FIG. 5 which required 2M×i transistors per slice. Similarly, i(M+2S) configuration bits are required for the routing architecture illustrated in FIG. 7 as opposed to 2M×i configuration bits for that illustrated in FIG. 5.

The above can be generalized by considering the case where more than two logic blocks per slice may be implemented. If L represents the number of groups of outputs from the programmable interconnect matrix 602 (i.e., the number of logic blocks per slice, where each logic block receives an equal number i of inputs), the number of routing elements for a single output becomes M+L×S. This assumes that each of the groups of outputs contains an equal number of outputs.

The routing architecture illustrated in FIG. 7 thus includes a number of switching elements 702 grouped so as to provide one or more outputs 614 for a number of inputs 612.

The grouping (i.e., the arrangement between primary and secondary multiplexers) can be said to represent the hierarchy of selection levels. A first level selection occurs when selection among groups of input signal 612 is made at the primary multiplexer 614. A second selection is made when individual ones of the outputs of the primary multiplexers are selected at the level of the secondary multiplexer 608. Of course, this scheme can be extended to additional levels of multiplexers, for example third or fourth level multiplexers, etc., wherein for each lower level of multiplexers there are a number of corresponding higher level multiplexers equal to the number of inputs of the corresponding lower level multiplexer. For the case illustrated in FIG. 7, each of the secondary multiplexers 608 has an associated number of primary multiplexers 604 corresponding to the number of inputs to the secondary multiplexer 608. At each of the selection levels then, there are fewer outputs provided than inputs received.

Where the routing architecture is embodied within a programmable interconnect matrix of a programmable logic device, the programmable logic device may include logic blocks and at least a subset of the input 612 may be provided by local feedback signals from one or more of these logic blocks.

Viewed another way, the multi-level routing architecture provides a means for interconnecting signals in a connection circuit (e.g., programmable interconnect matrix 602) of a programmable logic device. More specifically, the multi-level routing architecture interconnects inputs to the connection circuit to outputs of the connection circuit. The interconnections may be provided by coupling higher-level signals within the routing architecture to lower-level signals therein, for example, coupling an input signal to an intermediate signal and coupling the intermediate signal to an output signal. For the illustrated case, the coupling of signals at the various levels of the multi-level routing architecture is achieved by selecting among inputs to various multiplexers. However, it should be kept in mind that as used throughout this description, the term multiplexer refers to any circuit that performs a multiplexing function (e.g., a selection of one input conductor from a number of input conductors).

If each of the switching elements 702 of the programmable interconnect matrix 602 is viewed as a load to either an input line or an output line of the programmable interconnect matrix, the following observation can be made. To achieve the same routing, the routing architecture of FIG. 7 loads less heavily the input lines of the programmable interconnect matrix 602 and the output lines to the logic blocks than is the case for the scheme shown in FIG. 5. For example, each of the inputs 612 shown in FIG. 7 is loaded by two switching elements 702 for the case where two output signals are provided per logic block. Alternatively, for the scheme illustrated in FIG. 5, each of the M inputs is loaded by four programmable elements 502. Likewise, for each output signal of a secondary multiplexer 608 shown in FIG. 7, there are four switching elements 702 loading the output line. However, for each output of a multiplexer 402 in FIG. 5, there are 12 programmable elements loading the line. Thus, the routing architecture of the present invention loads less heavily the input and output lines of the programmable interconnect matrix, improving switching speeds for these lines. It is true that two individual switching elements 702 (one at the level of the primary multiplexer and another must be traversed per route for the new routing architecture. However, with proper load balancing, a net increase in switching speed should be achieved.

Figure 8:
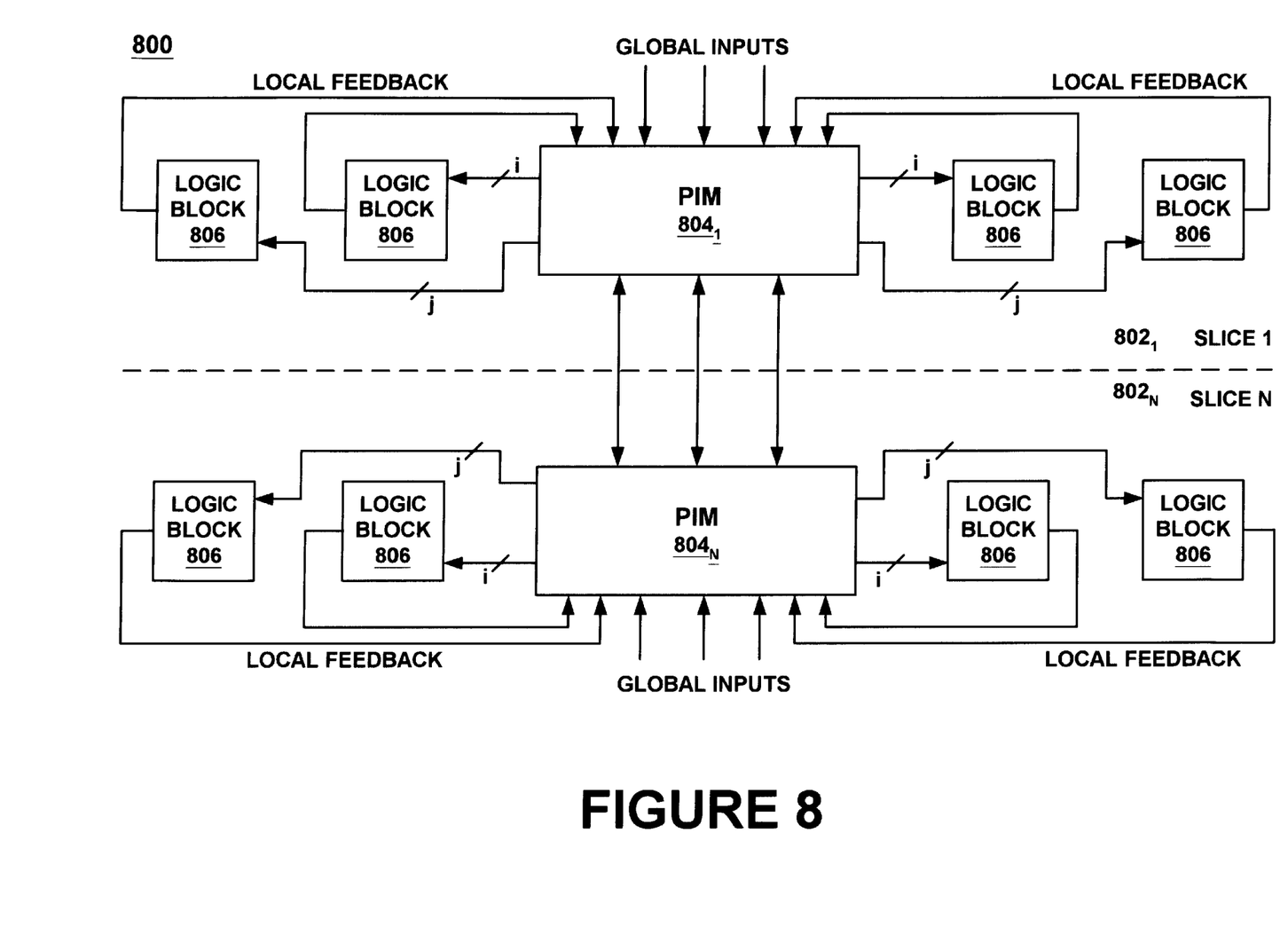
FIG. 8 illustrates a complex programmable logic device having a programmable interconnect matrix configured in accordance with an embodiment of the present invention.

In addition to the above, the new routing architecture provides for relatively easy scalability, for example, if more than two logic blocks per slice of a programmable logic device are to be implemented. With the conventional scheme shown in FIG. 5, there is no easy way to add more than two logic blocks per slice and, in fact, what is required is a separate PIM slice. In contrast, for the routing architecture shown in FIG. 7, if another logic block or blocks are to be added per slice, one need only add additional secondary multiplexers 608 to provide output signals 614 for those logic blocks. Such a scheme is illustrated in FIG. 8 which shows a CPLD 800 divided into slices $802_1$–$802_N$, wherein each slice includes a slice of programmable interconnect matrix $804_1$–$804_N$ and four logic blocks 806. Each of the logic blocks 806 may receive an equal number of input signals (e.g., i=j) from its respective slice of programmable interconnect matrix $804_1$–$804_N$. Alternatively, by utilizing the appropriate number of switching elements at the level of secondary multiplexers (or third or fourth, etc. level multiplexers), different numbers of input signals (e.g., i≠j) may be provided to different logic blocks 806. As more logic blocks are provided per slice 802, although an increased number of switching elements are required, the increase is not linear, as would be the case for schemes such as that shown in FIG. 5.

The routing architecture of the present invention may also make use of the principal of locality, wherein signals provided by a logic block on a left half of a slice which are fed back to a programmable interconnect matrix often need to be used again in the logic block on the left half of the slice. This is a consequence of the routing software used to program programmable logic devices. To take advantage of this principal, secondary multiplexers within the programmable interconnect matrix could be made selective in terms of which signals are provided with routing path to left or right logic blocks. Of course, other routing architectures which take advantage of the principals of the present invention are also conceivable.

Thus, a novel programmable interconnect matrix architecture for use with programmable logic devices has been described. However, as indicated above, many embodiments of the present invention are possible and the illustrated examples set forth above should in no way limit the present invention as defined by the appended claims.

What is claimed is:

1. A programmable logic device, comprising:
    a programmable interconnect matrix comprising a plurality of interconnected switching elements grouped so as to provide one or more outputs for a plurality of inputs, wherein the grouping represents a hierarchy of selection levels;
    wherein the selection levels comprise a number of interconnected primary and secondary multiplexers, the interconnection of the primary and secondary multiplexers defining the hierarchy of the selection levels, wherein for each of the secondary multiplexers there are a number of corresponding primary multiplexers equal to a number of inputs of a corresponding secondary multiplexer; and
    wherein the switching elements in each succeeding selection level of the hierarchy of selection levels have a number of inputs equal to the number of outputs of switching elements of an immediately preceding level of the hierarchy of selection levels.

2. A programmable logic device as in claim 1 wherein at each of the selection levels fewer outputs are provided than inputs received.

3. A programmable logic device as in claim 1 further comprising a plurality of logic blocks coupled to the programmable interconnect matrix, each of the logic blocks coupled to receive at least one of the outputs.

4. A programmable logic device as in claim 3 wherein a subset of the plurality of inputs are provided by one or more of the logic blocks.

5. A programmable interconnect matrix comprising a plurality of routing elements arranged in an hierarchical routing scheme, the number of routing elements being equal to M+L×S, where M represents the number of number of inputs to the programmable interconnect matrix, L represents the number of groups of outputs from the programmable interconnect matrix, and S represents the number of routing elements at the lowest level of the hierarchical routing scheme, wherein S is more than one.

6. A programmable logic device comprising the programmable interconnect matrix of claim 5.

7. A programmable logic device as in claim 6 further comprising a number of logic blocks, each of the logic blocks coupled to receive one of the groups of outputs from the programmable interconnect matrix.

8. A programmable logic device as in claim 7 wherein at least one of the logic blocks is configured to provide at least one of the inputs to the programmable interconnect matrix.

9. A programmable logic device comprising a plurality of the programmable interconnect matrices of claim 5 each having an associated number of logic blocks.

10. A programmable logic device comprising:
a programmable interconnect matrix, the programmable interconnect matrix comprising a plurality of selection levels comprising a plurality of multiplexers arranged in a multi-level interconnection scheme so as to provide a first number of output signals from a second number of input signals, wherein the plurality of multiplexers are arranged as primary multiplexers and secondary multiplexers, the primary multiplexers configured to receive the input signals and the secondary multiplexers configured to provide the output signals;

wherein the multiplexers each comprise a number of switching elements, wherein an input signal at a first one of a first number of switching elements of a first level of the multi-level interconnection scheme is selected to produce an intermediate signal, and wherein at a second switching element of a second level of the multi-level interconnection scheme the intermediate signal is selected from a number of inputs equal to the first number of switching elements.

11. A programmable logic device as in claim 10 wherein each secondary multiplexer is coupled to an equal number of primary multiplexers.

12. A programmable logic device as in claim 11 further comprising a plurality of logic blocks, each logic block coupled to receive one or more of the output signals.

13. A programmable logic device as in claim 10 wherein each of the secondary multiplexers is associated with a subset of the number of primary multiplexers and configured to provide one of the number of output signals.

14. A programmable logic device as in claim 12 wherein at least one of the input signals is provided by one of the logic blocks.

* * * * *